United States Patent [19]
Barbara et al.

[11] Patent Number: 5,170,120
[45] Date of Patent: Dec. 8, 1992

[54] ROTOR SYNCHRONIZED CROSS POLARIZATION OF SOLID STATE NMR

[75] Inventors: Thomas M. Barbara, Cupertino; Arthur L. Brooke, Sunnyvale; Evan H. Williams, Menlo Park, all of Calif.

[73] Assignee: Varian Associates, Inc., Palo Alto, Calif.

[21] Appl. No.: 555,955

[22] Filed: Jul. 19, 1990

[51] Int. Cl.$^5$ .............................................. G01V 3/00
[52] U.S. Cl. ..................................... 324/307; 324/321
[58] Field of Search ............... 324/321, 318, 313, 310, 324/309, 308, 300, 307

[56] References Cited

U.S. PATENT DOCUMENTS

| | | | |
|---|---|---|---|
| 4,301,410 | 11/1981 | Wind et al. | 324/321 |
| 4,305,036 | 12/1981 | Ernst et al. | 324/321 |
| 4,628,263 | 12/1986 | Kid | 324/321 |
| 4,996,483 | 2/1991 | Beer et al. | 324/321 |

OTHER PUBLICATIONS

Yarim-Agaev et al., "Sample Spinning at the Magic Angle With Rotation-Synchronized rf Pulses", *Journal of Magnetic Resonance*, vol. 47 (1982), pp. 51–60.

Ziegler et al., "The Stop-and-Go Spinning Technique in MAS Experiments", *Journal of Magnetic Resonance*, vol. 79, (1988) pp. 299–306.

Levitt et al., "Spin Dynamics and Thermodynamics in Solid-State NMR Cross Polarization", *Journal of Chem. Physics*, vol. 84, (1986), pp. 4243–4255.

N. C. Nielsen et al. "Toss in High-Speed MAS NMR" *Journal of Magnetic Resonance*, vol. 80, No. 1, Oct. 15, 1988, pp. 149–154.

Y. Ogura et al. "A New Method for Static Imaging of a Rotating Object", *Journal of Magnetic Resonance*, vol. 83, No. 1, Jun. 1989, pp. 177–182.

*Primary Examiner*—Louis Arana
*Attorney, Agent, or Firm*—Edward H. Berkowitz

[57] ABSTRACT

The cross polarization condition for hetero-coupled NMR spectroscopic investigations for a sample spinning at rate $\omega_R$ is improved by causing at least one of the RF excitation channels to emit pulses in synchronous relationship to the sample spinner during the cross polarization contact whereby dependence of the NMR signal on mechanical spin rate $\omega_R$ is reduced.

5 Claims, 5 Drawing Sheets

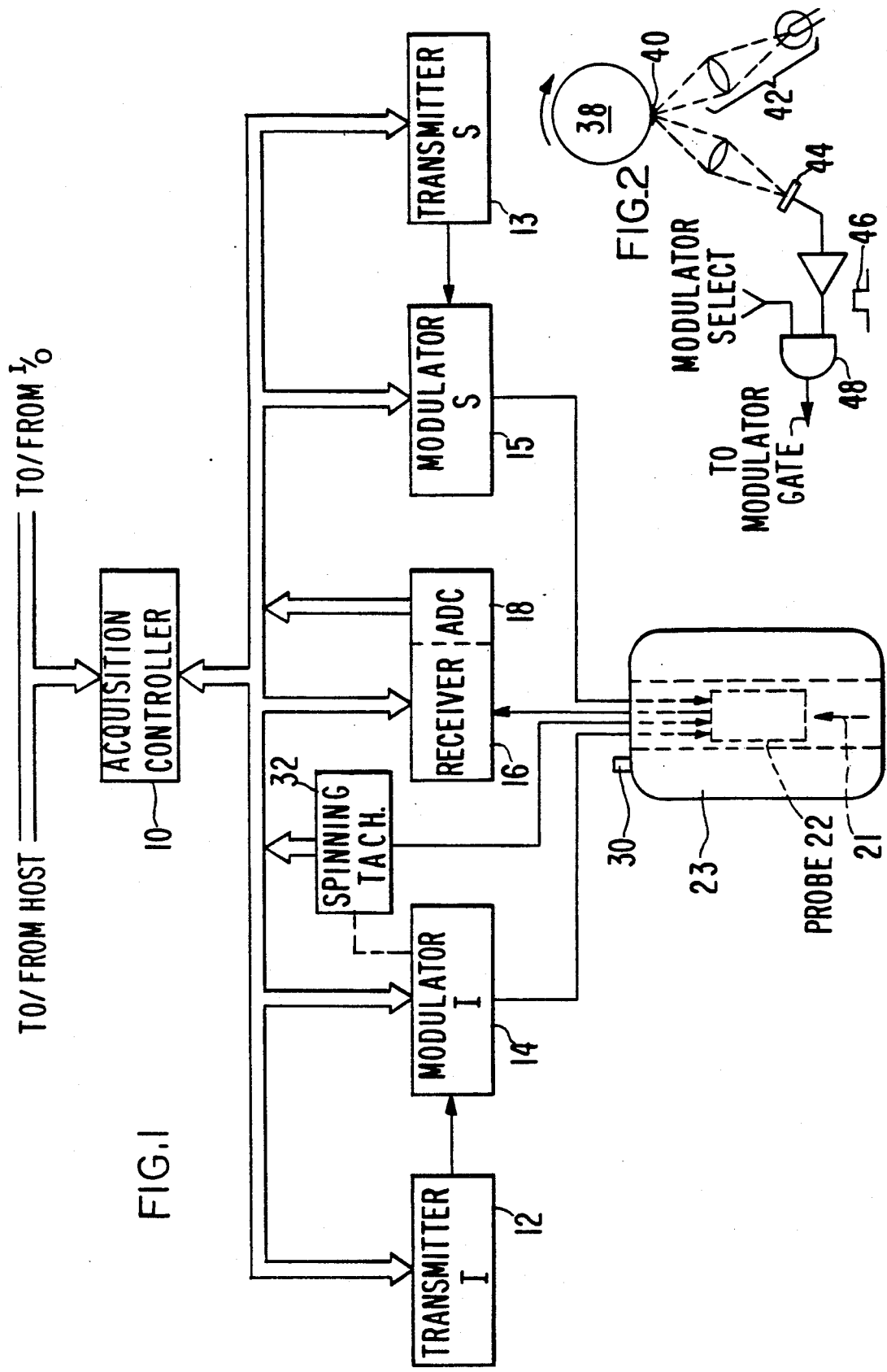

HEXAMETHYLBENZENE

HEXAMETHYBENZINE

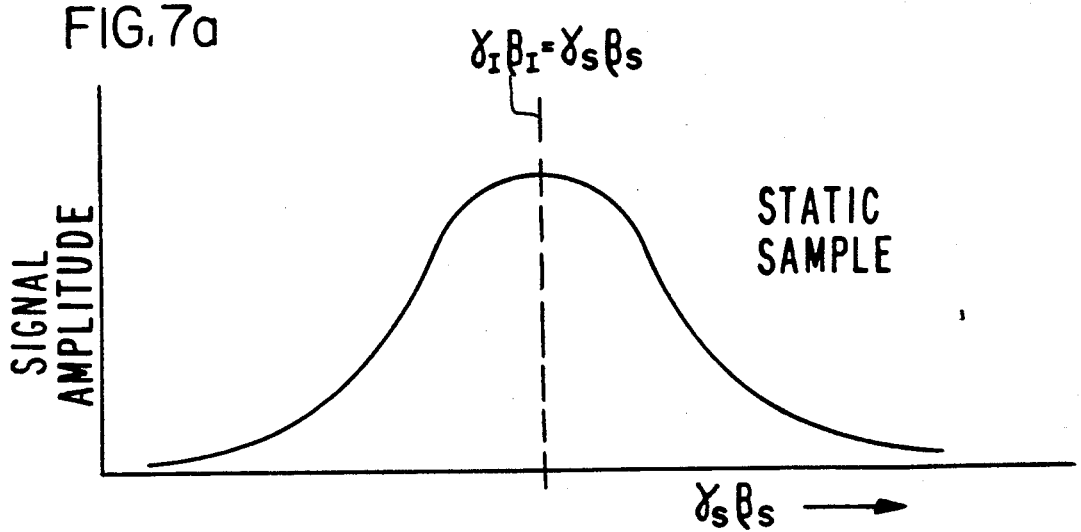
FIG. 7a — STATIC SAMPLE
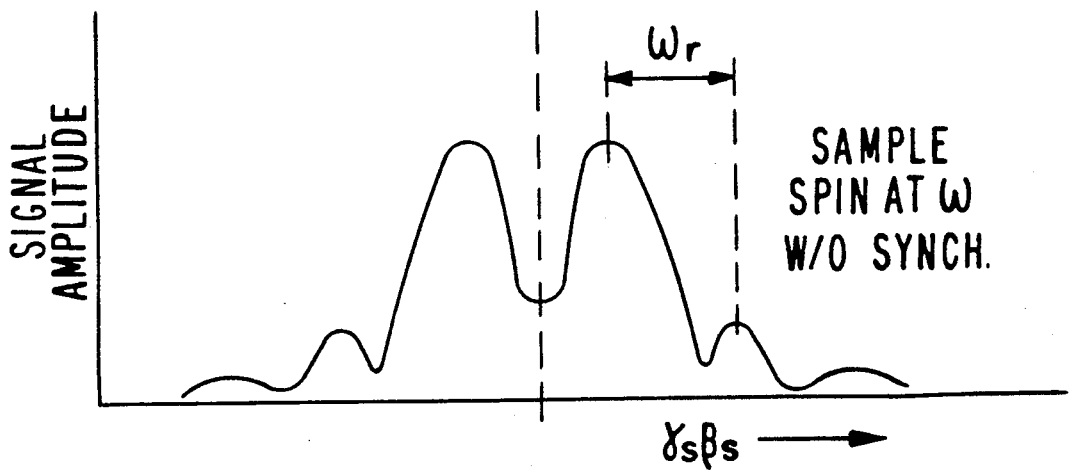
FIG. 7b — SAMPLE SPIN AT ω W/O SYNCH.
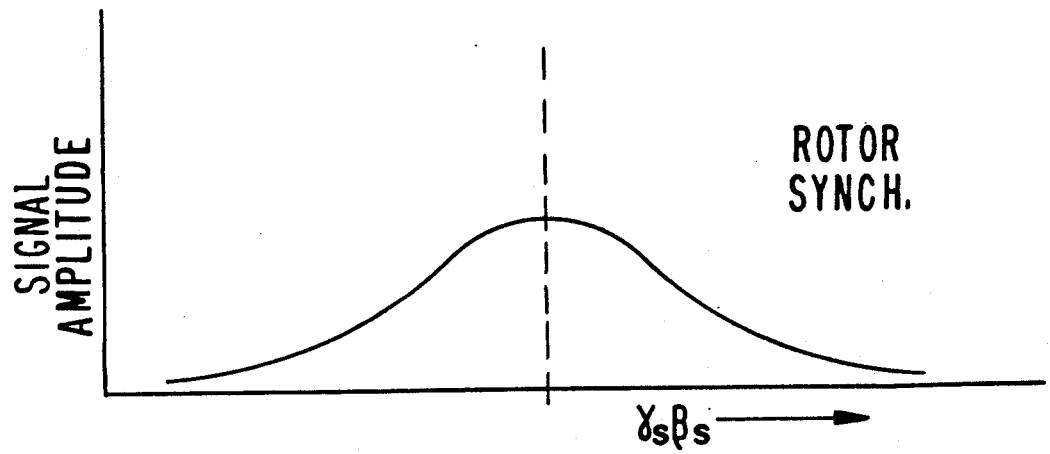
FIG. 7c — ROTOR SYNCH.

ROTOR SYNCHRONIZED CROSS POLARIZATION OF SOLID STATE NMR

FIELD OF THE INVENTION

The present invention relates to nuclear magnetic resonance phenomena and in particular to the enhancement of such studies in the context of cross polarization measurements.

BACKGROUND OF THE INVENTION

Cross polarization experiments in NMR provide a vehicle for enhancing the resonance signal for nuclei which exhibit a low value of the gyromagnetic ratio $\gamma_s$ through transfer of magnetization from a resonant nuclei exhibiting a high gyromagnetic ratio $\gamma_I$ in relation to the nuclei of $\gamma_s$. This transfer occurs when the separate rotating frame precession frequencies for the two nuclear species are caused to coincide yielding the Hartman-Hahn condition.

$$\gamma_I B_1^{(I)} = \gamma_s B_1^{(s)}$$

Where the subscripts and superscripts label respective nuclei of low (S) and high (I) gyromagnetic ratio such as $C^{13}$ and protons, and the corresponding rf magnetic fields.

For high resolution NMR it is most often desirable to mechanically rotate the sample about a selected axis. This mechanical rotation is ordinarily accomplished with a pneumatic apparatus for the purpose of averaging inhomogeneities of the field and, for solids, inhomogeneities of the sample structure. Rotation rates of the order of $10^3$–$10^4$ Hertz are typical. One result of a mechanical rotation is the imposition of spinning sidebands on the NMR excitation and the NMR signal with the result that stringent conditions are imposed on the rf magnetic field amplitudes observed at the sample in a cross polarization experiment.

In one technique of prior art the modulation arising from the spinning operation is removed by arranging for the spinner to be stationary during a cross polarization evolution period, $t_1$. At the conclusion of the interval $t_1$, the transverse magnetization is protected by application of an appropriately phased 90° pulse to preserve the magnetic properties of the system for a brief period while the spinner is brought up to speed, after which the experiment is completed with the rf fields applied to the respective spin subsystems. In this approach the measurement requires great expenditure of time to allow for the rotor to return to a stable rotation at the desired rate. During this return to the stable rotation condition some loss of magnetization will be experienced (as a function $T_1$) thereby degrading the signal to noise ratio. An example of this prior art approach will be found in J. Mag. Res., Vol. 79, pp. 299–306 (1985).

It is also known to synchronize rf pulses with the sample rotor at multiple angular intervals of sample rotation following a period of cross polarization for the purpose of adapting the width of a so-called powder pattern (continuous spectrum arising from random oriented crystallites) to a desired frequency interval so as to avoid overlap of powder patterns. The technique is discussed by Yarin-Agaev et al., J. Mag. Res., G. 47, pp. 51–60 (1982).

In the present invention the efficiency of polarization transfer and certain other benefits are found to result from the use of rotor synchronized pulses employed to establish the Hartman-Hahn condition in an improved manner. An important example of auxiliary benefit is that with the present invention the integrated resonant signal acquires greater independence of rotor speed and Hartman-Hahn efficiency, thereby providing a more reliable quantitative indicia of the density of specific nuclei. This consequence permits spinning at high rates, a desirable goal at the high magnetic fields characterizing the subject measurements. Further, the practice of this invention increases tolerance of mechanical instability which may accompany the highest spinning rates. Thus, there is not required the complexity of maintaining an exacting spin rate stabilization servo-loop.

The present invention is directed to removal or reduction of the spinning modulation imposed on a cross polarization condition due to sample spinning. It is accomplished by applying a rotor synchronous modulation to either, or both rf fields employed to produce the cross polarization condition.

The rotor-synchronous modulation may be directed to the rf amplitude or the phase. This modulation may be derived from the rotor by any of a number of well known arrangements.

BRIEF DESCRIPTION OF THE DRAWINGS

FIG. 1 is a schematic illustration of apparatus of the invention.

FIG. 2 is a typical arrangement for obtaining rotar-synchronization.

FIG. 7A illustrates the resonant signal amplitude as a function of excitation power for a static sample using the FIG. 5A sequence.

FIG. 7B illustrates resonant signal amplitude as a function of excitation power for a rotating sample using the FIG. 5A sequence.

FIG. 7C illustrates resonant signal amplitude as a function of excitation power using sequence of FIG. 6A.

DETAILED DESCRIPTION OF THE INVENTION

Figure 3:
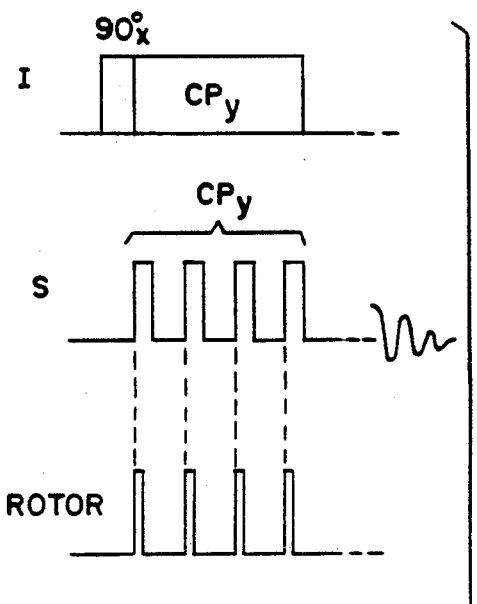
FIG. 3 illustrates a portion of a pulse sequence of the invention.

Portions of an NMR apparatus for practice of the invention are described schematically in FIG. 1. An acquisition control processor 10 communicates with first channel "I" rf transmitter 12 and second "S" rf transmitter 13 and with corresponding rf modulators 14 and 15. These separate rf transmitter channels in turn are directed to NMR probe 22 containing a sample for investigation. The probe 22 is situated within a magnetic field 21 ordinarily maintained within the bore 29 of superconducting magnet/cryostat 23.

The probe assembly 22 for NMR studies also provides for the reception of the resonance signal excited in the sample by operation of rf channels "I" and/or "S". A signal originating from de-exciting nuclei is induced in a resonant circuit, (not shown), pre-amplified and directed to receiver 16, converted to a digital form by analog-to-digital converter 18 and further processed by the aquisition processor and host computer (not shown).

It is common practice in high resolution NMR studies to cause the sample to undergo a mechanical rotation about a selected axis. Thus the probe 22 will include pneumatic apparatus for maintaining a gas bearing and gas actuated rotor to which the sample is secured. Means for effectuating such rotation and controlling same are well known in the art. The rotation rate of the rotor is observed with the spinning tachometer 32. A representative arrangement for providing such a signal is shown in FIG. 2 and utilizes a reflective spot 40 on the periphery of the rotor 38 which is illuminated by light source 42 and observed by a photo-diode 44 to provide a simple square wave signal 46 with a repetition rate representative of the rotation rate. The timing pulse combined in gate 48 with a Modulator Select signal actuates a gate whereby the desired modulation is impressed on the respective RF carrier.

A first embodiment of the invention is further described in FIG. 3 in a general sense. Rotor pulses are developed as above described and are applied to gate "I" modulator 14 for manipulation of the magnetization of a first nuclear species (such as $H^1$) by a desired angle with respect to the magnetic field 21. Immediately thereafter, a long cross polarization pulse ("CP") is applied to spin lock the "I" magnetization and cause precession of same about y (in the rotating frame of I). A similar spin-lock and precession about y in the rotating frame of S permits enhancement of the latter signal (theoretically) by amount $\gamma_I/\gamma_S$. "S" modulator 15 provides rf radiation for bringing a second nuclear species, such as $C^{13}$, to resonance. The proton modulator (14) provides for essentially continuous radiation while the $C^{13}$ modulator is synchronized through the aforesaid gating logic to correlate $C^{13}$ channel radiation with the rotor. While FIG. 3 indicates a repetition rate for the $C^{13}$ modulator equal to the rotor rate and in phase therewith, one will understand that these are not requirements of the invention. The occurrence or rotor gated $C^{13}$ radiation may lead or lag the rotor pulse with any desired (substantially constant) phase. Further, the repetition rate may be any desired harmonic or sub-harmonic of the rotor rate. The duty cycle of the $C^{13}$ radiation may be any selected fraction of the rotor period. In the limit of 100% duty cycle, the advantage of rotor synchronization is lost. As the duty cycle approaches zero, the phenomenon of cross polarization is not achieved. The particular choice of duty cycle depends upon criteria outside the scope of this work.

Figure 4:
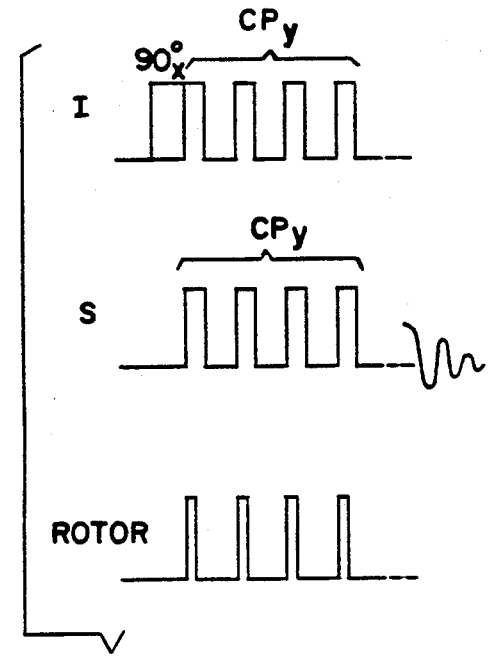
FIG. 4 is a portion of another pulse sequence of the invention.

The pulse sequences of FIGS. 3 and 4 are not complete. Rather these represent improvement in the cross polarization or contact portion of any experiment wherein cross polarization is employed with a spinning sample. Accordingly, the selection of such further operation as decoupling, further rotations of either spin species, timing of evaluation intervals or data acquisition are outside the scope of this work.

In FIG. 4 a second embodiment is illustrated wherein both channels of rf irradiation are rotor synchronized. Again, the channel pulse repetition rate, phasing with respect to the rotor rate and the duty cycle are independently selectable for each channel.

Figure 5A:
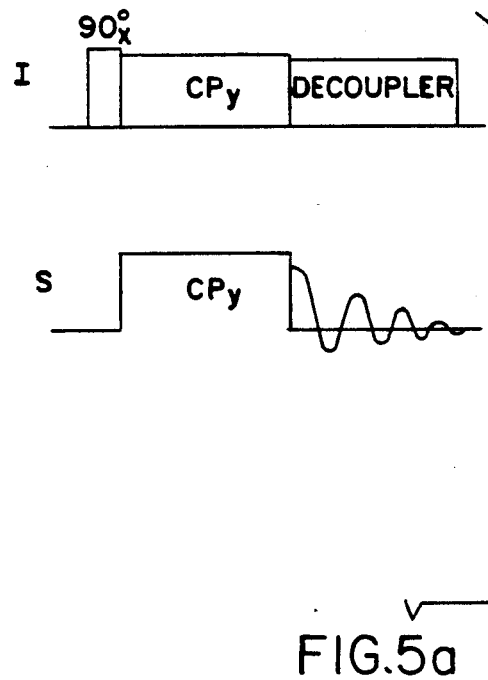
FIG. 5 is a CPMAS pulse sequence of prior art.
FIG. 5B is the set of spectra resulting from the reference of FIG. 5A for several values of $C^{13}$ power.

The portion of the measurement procedure following the rotor synchronized Hartman-Hahn condition is unspecified and thus beyond the scope of the present invention. For the sake of illustration of the advantage of the invention, a simple CPMAS sequence is shown in FIG. 5A wherein the $C^{13}$ FID is observed while decoupling radiations are applied to the protons. This sequence was applied to a sample of hexamethylbenzene (without rotor synchronization) spinning in about 6 KHZ. At FIG. 5B the experimental spectra are repeated for 8 values of power applied to the $C^{13}$ resonance channel while the rf power applied to the proton channel was maintained constant. One observes that at the lowest $C^{13}$ power no spectrum is obtained and further that there is a decided dependence for signal-to-noise which is observed over the range of $C^{13}$ power. Moreover, the relative intensities of the multiplet members within any one spectrum depend upon the power applied at the $C^{13}$ channel.

Figure 6A:
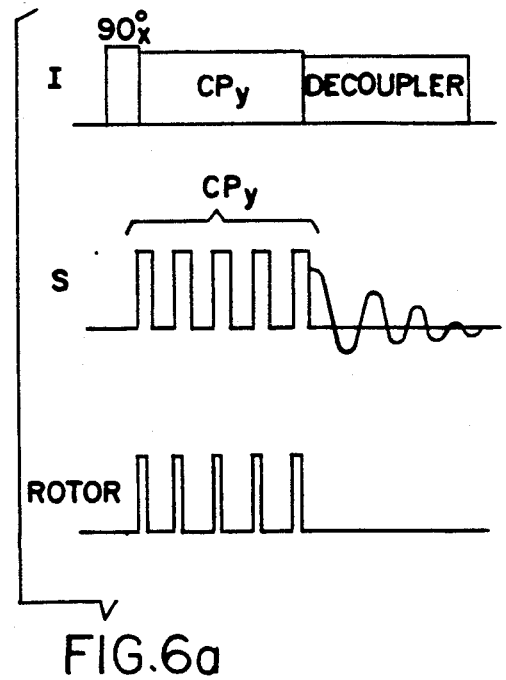
FIG. 6A is a CPMAS pulse sequence of the present invention.
Figure 5B:
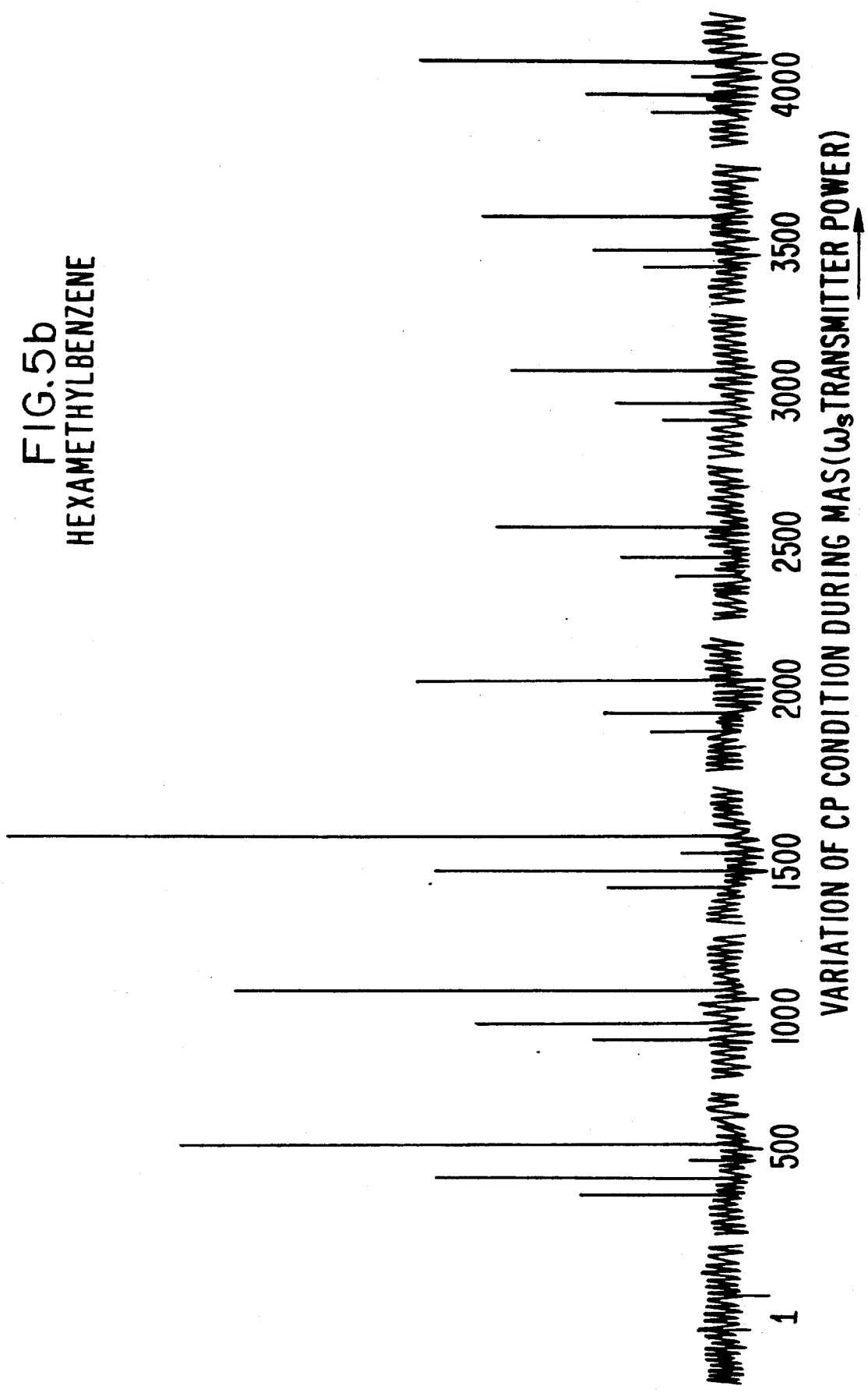
Figure 6B:
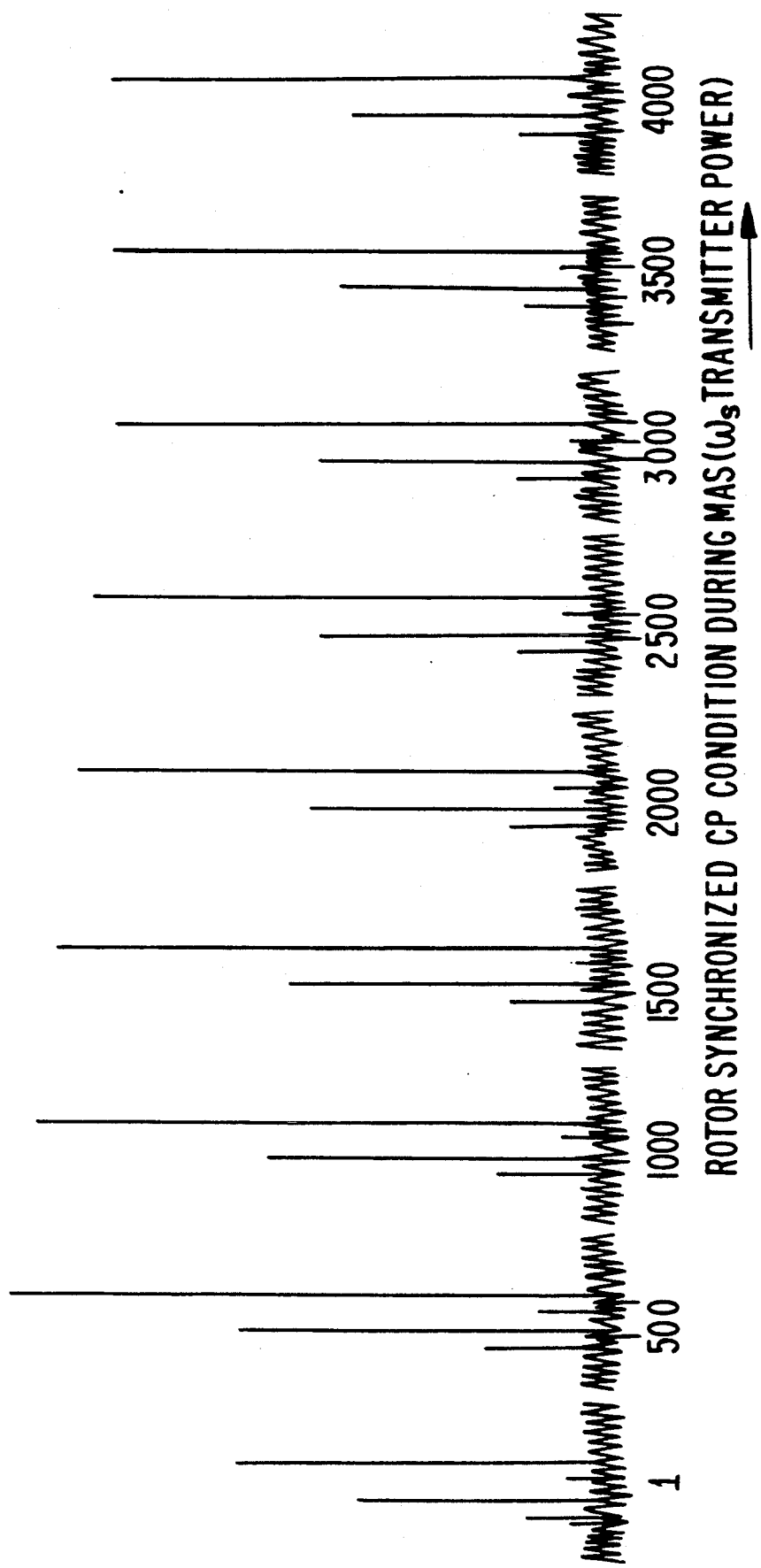
FIG. 6B shows spectra resulting from the FIG. 6A sequence for several values of $C^{13}$ power.

The data of FIG. 6B is obtained in the same manner as the data of FIG. 5B using the pulse sequence illustrated in FIG. 6A. This pulse sequence differs from the sequence of FIG. 5A in that the $C^{13}$ spins are repeatedly nutated in synchronous relation to the rotor pulse (s). The additional constraint of rotor synchronization following the present invention is applied with a repetition rate equal to the rotation rate with a duty cycle of 28%. It is evident that the signal-to-noise dependence of FIG. 5 has been greatly reduced and the relative intensities of multiplet members in the resulting spectra are substantially independent of variation in the $C^{13}$ power.

The explanation for the improved performance for rotor synchronous cross polarization is aided by reference to FIGS. 7A and 7B. In FIG. 7A, the resonant signal amplitude is schematically indicated for a nonspinning sample as a function of the resonant frequency for one nuclear species in a cross polarization experiment. For a spinning sample, FIG. 7B indicates a corresponding behavior, given a spinning $\omega_R$ for the sample. FIG. 7B may be regarded as the effect of applying the rotor synchronous constraint to the excitation of $C^{13}$ in FIG. 6A is equivalent to a transformation into a reference frame rotating at the sample spinning rate $\omega_R$, e.g. the stationary condition obtains because the effect of the mechanical rotation at rate $\omega_R$ has been removed by the synchronous constraint. This behavior is illustrated in FIG. 7C, where the signal amplitude response function exhibits the same shape with scale reduced is a function of duty cycle. Each of the several spectra of FIG. 6A corresponds to acquiring the data at some point along a curve such as that sketched in FIG. 7C. In contrast, the resonant signal intensity for a spinning sample for which data is acquired without synchronization corresponds to acquiring data at corresponding points on the curve of FIG. 7B. Both of these figures may be regarded as describing a modulus of the resonant signal. Accordingly, the left most spectrum of FIG. 6A is nicely observed, whereas the corresponding spectrum for the nonsynchronous case is absent. That value of the $C^{13}$ excitation power is assumed to correspond, at least approximately, to a deep local minimum of the sketch of FIG. 7B. Most of the spectrum of FIG. 6A are distributed over the relatively flat region of the FIG. 7C sketch whereas the corresponding condition for FIG. 7B are subject to an oscillatory factor superimposed on the smooth behavior of FIG. 7C.

Many modifications and variations of the embodiments described herein will be apparent to those ordinarily skilled in the art. Such modifications and variations will still be within the scope of the invention. Therefore, the invention should not be limited by the scope of the embodiments described, but only by the claims which follow:

What is claimed is:

1. Magnetic resonance apparatus for study of a composition of a sample of nuclear magnetic resonators, comprising:
   (a) polarizing magnet means for imposing a DC magnetic field on said sample and first RF irradiation means for imposing a first RF field on said sample in a direction orthogonal to said DC field, said first RF field comprising a time dependent oscillatory magnetic field, whereby a resonance condition is excited in said sample,
   (b) RF receiver means for obtaining an RF signal from the de-excitation of said resonators,
   (c) sample rotation means for spinning the sample about a selected axis, said means further comprising synchronous signal generation means to provide indicia of the instantaneous angular displacement of the spinning sample,
   (d) first modulation means responsive to said synchronous signal generating means in combination with said first RF irradiation means for causing a resonant condition for the transfer of energy from said first RF field to an aggregate of first resonators comprising said sample, and,
   (e) second RF irradiation means for providing a resonant transfer of energy to second resonators comprising said sample.

2. The apparatus in claim 1 wherein said rotor synchronous modulation is a phase modulation of at least one said rf field means.

3. The apparatus of claim 1 wherein said rotor synchronous modulation is an amplitude modulation of at least one said rf field means.

4. The apparatus of claim 2 or 3 wherein said apparatus comprises second modulation means for causing a resonant condition for the transfer of energy from said second rf field to an aggregate of said second resonators comprising said sample.

5. The method of measuring a nuclear magnetic resonance signal obtained from a rotating sample, comprising distinct first and second resonating nuclear species comprising,
   (a) deriving a rotation signal from said rotating sample to establish a coincidence of a selected angular coordinate of said rotating sample with a fixed angular interval,
   (b) establishing a gate interval in synchronous relationship with said rotation signal,
   (c) exciting nuclear magnetic resonance of first resonating species in said sample substantially in fixed phase relation with said gate interval while maintaining nuclear magnetic resonant excitation of said second resonating species.

* * * * *